(12) United States Patent
Hyland et al.

(10) Patent No.: US 9,105,579 B2
(45) Date of Patent: Aug. 11, 2015

(54) GAN POWER DEVICE WITH SOLDERABLE BACK METAL

(75) Inventors: Patrick James Lazlo Hyland, San Jose, CA (US); Brian Joel Alvarez, San Jose, CA (US); Donald R. Disney, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/552,365

(22) Filed: Jul. 18, 2012

(65) Prior Publication Data
US 2014/0021479 A1   Jan. 23, 2014

(51) Int. Cl.
*H01L 21/285* (2006.01)
*H01L 23/495* (2006.01)
(Continued)

(52) U.S. Cl.
CPC ...... *H01L 21/28575* (2013.01); *H01L 23/4827* (2013.01); *H01L 23/49513* (2013.01); *H01L 24/05* (2013.01); *H01L 24/83* (2013.01); *H01L 24/92* (2013.01); *H01L 29/417* (2013.01); *H01L 24/03* (2013.01); *H01L 24/06* (2013.01); *H01L 24/27* (2013.01); *H01L 24/29* (2013.01); *H01L 24/32* (2013.01); *H01L 29/2003* (2013.01); *H01L 2224/0345* (2013.01); *H01L 2224/0347* (2013.01); *H01L 2224/0361* (2013.01); *H01L 2224/03462* (2013.01); *H01L 2224/04026* (2013.01); *H01L 2224/0518* (2013.01); *H01L 2224/05082* (2013.01); *H01L 2224/05124* (2013.01); *H01L 2224/05155* (2013.01); *H01L 2224/05164* (2013.01); *H01L 2224/05166* (2013.01); *H01L 2224/05169* (2013.01); *H01L 2224/05639* (2013.01); *H01L 2224/05644* (2013.01); *H01L 2224/06181* (2013.01); *H01L 2224/2732* (2013.01); *H01L 2224/27334* (2013.01); *H01L 2224/291* (2013.01); *H01L 2224/29116* (2013.01);
(Continued)

(58) Field of Classification Search
USPC .................. 257/155, 676, 765, 771, E33.051, 257/E23.158, E23.16; 438/534, 573, 688
See application file for complete search history.

(56) References Cited

U.S. PATENT DOCUMENTS

2001/0032999 A1 * 10/2001 Yoshida ........................ 257/332
2006/0118799 A1 *  6/2006 D'Evelyn et al. ............... 257/96
(Continued)

FOREIGN PATENT DOCUMENTS

WO    WO 2011013500 A1 *  2/2011

OTHER PUBLICATIONS

Final Office Action for U.S. Appl. No. 13/611,467, mailed Apr. 11, 2014, 23 pages.
(Continued)

*Primary Examiner* — Khaja Ahmad
(74) *Attorney, Agent, or Firm* — Kilpatrick Townsend & Stockton LLP

(57) ABSTRACT

A method for fabricating a vertical gallium nitride (GaN) power device can include providing a GaN substrate with a top surface and a bottom surface, forming a device layer coupled to the top surface of the GaN substrate, and forming a metal contact on a top surface of the vertical GaN power device. The method can further include forming a backside metal by forming an adhesion layer coupled to the bottom surface of the GaN substrate, forming a diffusion barrier coupled to the adhesion layer, and forming a protection layer coupled to the diffusion barrier. The vertical GaN power device can be configured to conduct electricity between the metal contact and the backside metal.

18 Claims, 8 Drawing Sheets

(51) Int. Cl.
  *H01L 29/417* (2006.01)
  *H01L 23/482* (2006.01)
  *H01L 29/20* (2006.01)
  *H01L 23/00* (2006.01)

(52) U.S. Cl.
  CPC .............. *H01L 2224/32245* (2013.01); *H01L 2224/83192* (2013.01); *H01L 2224/83815* (2013.01); *H01L 2224/9221* (2013.01); *H01L 2224/9222* (2013.01); *H01L 2224/92242* (2013.01); *H01L 2924/1033* (2013.01); *H01L 2924/1305* (2013.01); *H01L 2924/13062* (2013.01); *H01L 2924/13091* (2013.01)

(56) References Cited

U.S. PATENT DOCUMENTS

| | | | |
|---|---|---|---|
| 2007/0090481 | A1 | 4/2007 | Richieri |
| 2007/0096167 | A1* | 5/2007 | Francis et al. ............... 257/262 |
| 2007/0237978 | A1* | 10/2007 | Schubert ...................... 428/607 |
| 2008/0192791 | A1* | 8/2008 | Furukawa et al. .......... 372/50.12 |
| 2008/0265326 | A1* | 10/2008 | Hebert .......................... 257/355 |
| 2010/0133506 | A1* | 6/2010 | Nakanishi et al. ............. 257/13 |
| 2011/0092063 | A1* | 4/2011 | Kawai et al. .................. 438/602 |
| 2011/0204381 | A1* | 8/2011 | Okada et al. .................... 257/76 |
| 2012/0012968 | A1 | 1/2012 | Konsek |
| 2012/0175755 | A1 | 7/2012 | Bayerer ........................ 257/675 |
| 2012/0295428 | A1* | 11/2012 | Melnik et al. ................. 438/504 |
| 2013/0087879 | A1 | 4/2013 | Edwards et al. |
| 2013/0126885 | A1 | 5/2013 | Disney et al. |

OTHER PUBLICATIONS

Final Office Action for U.S. Appl. No. 13/611,467, mailed Jun. 19, 2014, 15 pages.

Notice of Allowance for U.S. Appl. No. 13/611,467, mailed Dec. 10, 2014, 9 pages.

\* cited by examiner

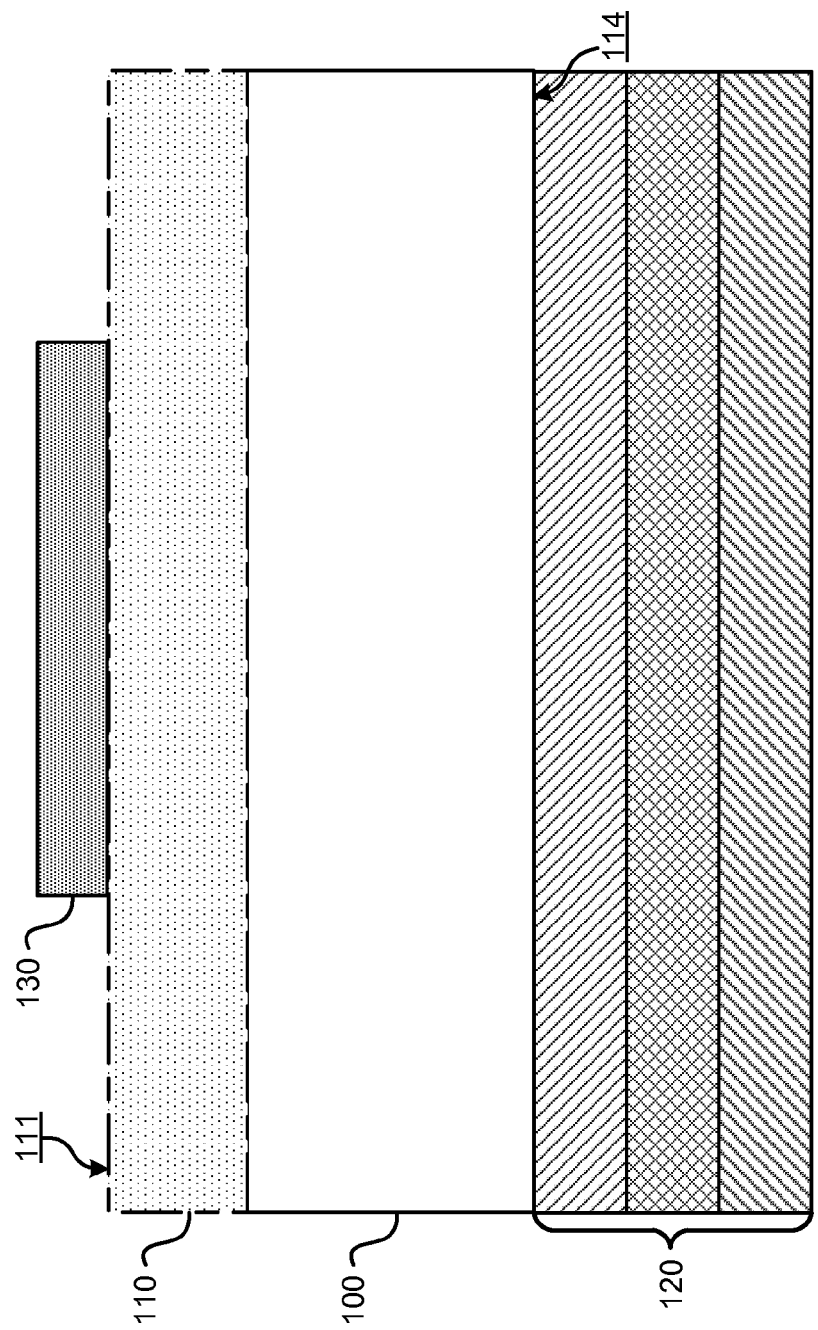

GAN POWER DEVICE WITH SOLDERABLE BACK METAL

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to providing a solderable back metal for vertical semiconductor devices. Merely by way of example, the invention has been applied to methods and systems for manufacturing vertical GaN power devices. The methods and techniques can be applied to a variety of vertical semiconductor devices, such as metal-oxide-semiconductor field-effect transistors (MOSFETs), bipolar transistors (BJTs, HBTs), diodes, and the like.

According to one embodiment of the present invention, a method for fabricating a vertical gallium nitride (GaN) power device includes providing a GaN substrate with a top surface and a bottom surface, forming a device layer coupled to the top surface of the GaN substrate, and forming a metal contact on a top surface of the vertical GaN power device. The method further includes forming a backside metal by forming an adhesion layer coupled to the bottom surface of the GaN substrate, forming a diffusion barrier coupled to the adhesion layer, and forming a protection layer coupled to the diffusion barrier. The vertical GaN power device can be configured to conduct electricity between the metal contact and the backside metal.

According to another embodiment of the present invention, a semiconductor device can include a gallium nitride (GaN) substrate with a top surface and a bottom surface, a device layer coupled to the top surface of the GaN substrate, and a metal contact on a top layer of the semiconductor device. The semiconductor device also can include a backside metal coupled to the bottom surface of the GaN substrate. The backside metal can include an adhesion layer coupled to the bottom surface of the GaN substrate, a diffusion barrier coupled to the adhesion layer, and a protection layer coupled to the diffusion barrier. The semiconductor device can be configured to conduct electricity between the metal contact and the backside metal.

According to yet another embodiment of the present invention, a method of making an Ohmic contact to a nitrogen face of a gallium nitride (GaN) substrate can include providing a GaN substrate having n-type conductivity, and forming an aluminum layer in electrical contact with the nitrogen face GaN substrate.

Numerous benefits are achieved by way of the present invention over conventional techniques. For example, embodiments of the present invention enable the use of solder to couple the back of a vertical power device directly to a lead frame of a package. As opposed to other methods of attaching a die to a package, such as using a conductive epoxy, soldering provides lower electrical resistance and lower thermal resistance, thus enabling higher current conduction, which can be especially advantageous in vertical power devices. These and other embodiments of the invention, along with many of its advantages and features, are described in more detail in conjunction with the text below and attached figures.

BRIEF DESCRIPTION OF THE DRAWINGS

FIGS. 1A-1B are simplified cross-sectional diagrams illustrating two embodiments of vertical semiconductor devices;

Figure 1B:
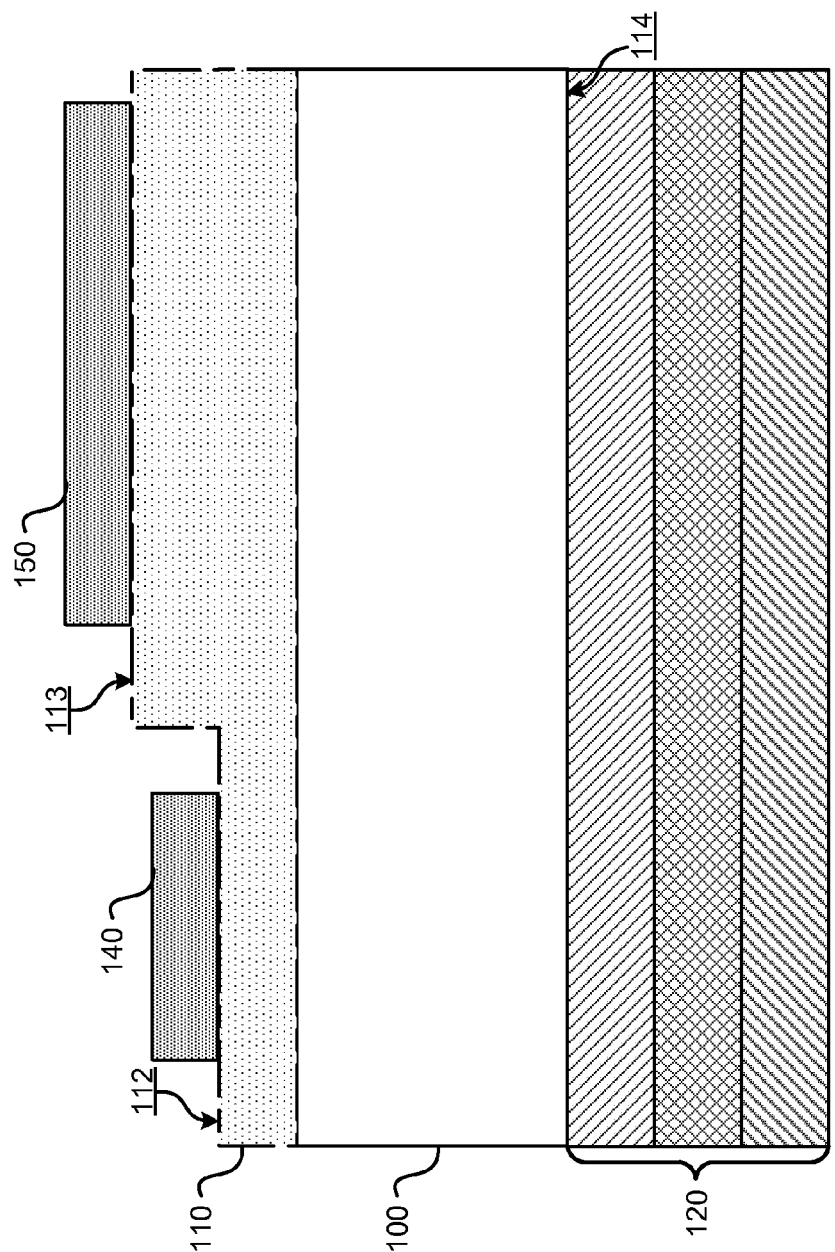

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to providing a solderable back metal for vertical semiconductor devices. Merely by way of example, the invention has been applied to methods and systems for manufacturing vertical GaN power devices. The methods and techniques can be applied to a variety of vertical semiconductor devices, such as metal-oxide-semiconductor field-effect transistors (MOSFETs), bipolar transistors (BJTs, HBTs), diodes, and the like.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, $\rho$, because resistivity is inversely proportional to electron mobility, as provided by equation (1):

$$\rho = \frac{1}{q\mu N}, \tag{1}$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \qquad (2)$$

where A is the cross-sectional area of the channel or current path.

These superior properties can give rise to improved semiconductor devices, such as vertical semiconductor devices. Traditional semiconductor devices are typically lateral devices that utilize only the top side of a semiconductor wafer, locating electrical contacts such that electricity travels laterally along the semiconductor surface. This tends to consume a large footprint on the semiconductor. Vertical semiconductor devices, on the other hand, utilize a smaller footprint to achieve the same performance as lateral devices. Vertical semiconductor devices have electrical contacts on both the top surface of the semiconductor and on the bottom surface, or backside, such that electricity flows vertically between the electrical contacts. Vertical power devices are vertical semiconductor devices that can be utilized in high power and/or high voltage applications.

FIGS. 1A-1B are simplified cross-sectional diagrams illustrating two embodiments of vertical semiconductor devices. In general, embodiments can include a GaN substrate 100, device layer(s) 110, one or more metal contacts 130, 140, 150 on a top surface, and a backside metal 120. Although embodiments shown in FIGS. 1A-1B and elsewhere herein describe the use of GaN materials, it will be understood that other semiconductor materials, including III-nitride semiconductor materials, can be used.

The form and function of the device layer(s) 110 can vary significantly, depending on desired functionality. Device layer(s) 110 can include, for example, one or more active regions, drift regions, PN junctions, P-I-N junctions, doped regions, intrinsic regions, insulating regions, and/or the like, depending on the functionality of the vertical semiconductor device. Examples of vertical semiconductor devices can include JFETs, MOSFETs, MESFETS, BJTs, HBTs, diodes, and the like.

Vertical semiconductor devices can have one or more metal contacts 130, 140, 150 on a top surface, depending on the type of device. The embodiment in FIG. 1A, for example includes a single metal contact 130 on a top surface 111 of the vertical semiconductor device. Such a device can include, for example, a diode. On the other hand, as shown in FIG. 1B, other embodiments of vertical semiconductor devices, such as transistors, can include multiple metal contacts 140, 150 in order to achieve additional device functionality. The metal contacts can be on a single top surface (not shown) or multiple top surfaces 112, 113, depending on the structure of the device layer(s) 110.

The vertical semiconductor devices of FIGS. 1A-1B also include a backside metal 120. Backside metals (also referred to herein as "back metals") are metals coupled to a bottom surface 114 of a semiconductor device. These backside metals 120 can be utilized in the packaging of semiconductor devices to provide a mechanical attachment to the semiconductor device's housing or package. Backside metals 120 can also provide a thermally conductive pathway for heat to be removed from the semiconductor device. Furthermore, in the case of vertical semiconductor devices, backside metals 120 can provide a low-resistivity path for current to flow in a vertical direction through the device, from a top surface through the device layer(s) 110 to the bottom surface 114 of the GaN substrate 100, and/or vice versa. This low resistivity connection facilitating vertical current flow is particularly beneficial for vertical power devices. As indicated in FIGS. 1A-1B, a backside metal 120 can include one or more metal layers. Furthermore, in some embodiments, multiple metal contacts may be formed from a backside metal 120, similar to the multiple metal contacts 140, 150 shown in FIG. 1B, depending on device functionality.

Often, backside metals are not solderable. Traditional, non-vertical devices, for example, typically include all electrical contacts on a top surface of the semiconductor. Therefore, there is not a need to electrically connect a backside metal to a lead frame. Accordingly, in many cases, devices are attached to a package with electrically insulating epoxy or electrically conductive (e.g. silver filled) epoxy, which is much less thermally conductive and has a much higher electrical resistivity than solder. Solder, on the other hand, has very good electrical and thermal conductivity. It is also known for good reliability under temperature cycling and environmental testing using high humidity levels at elevated temperatures. Therefore, for semiconductors requiring electrical and mechanical backside connections, such as vertical power devices, the backside metal of the semiconductor device can be soldered to the metal lead frame of an electronic package. Because vertical power devices using GaN and/or other III-nitride materials are only now in development, little has been done to form solderable backside metals to these devices.

The manufacture of vertical semiconductor devices in GaN and/or other III-nitride materials can be carried out in a variety of ways. FIGS. 2-7 illustrate a particular embodiment of a process for creating a solderable back metal on a vertical semiconductor device. Although the figures show only one vertical semiconductor device, the process described can be extended and/or modified to include the simultaneous manufacture of multiple vertical semiconductor devices.

Figure 2:
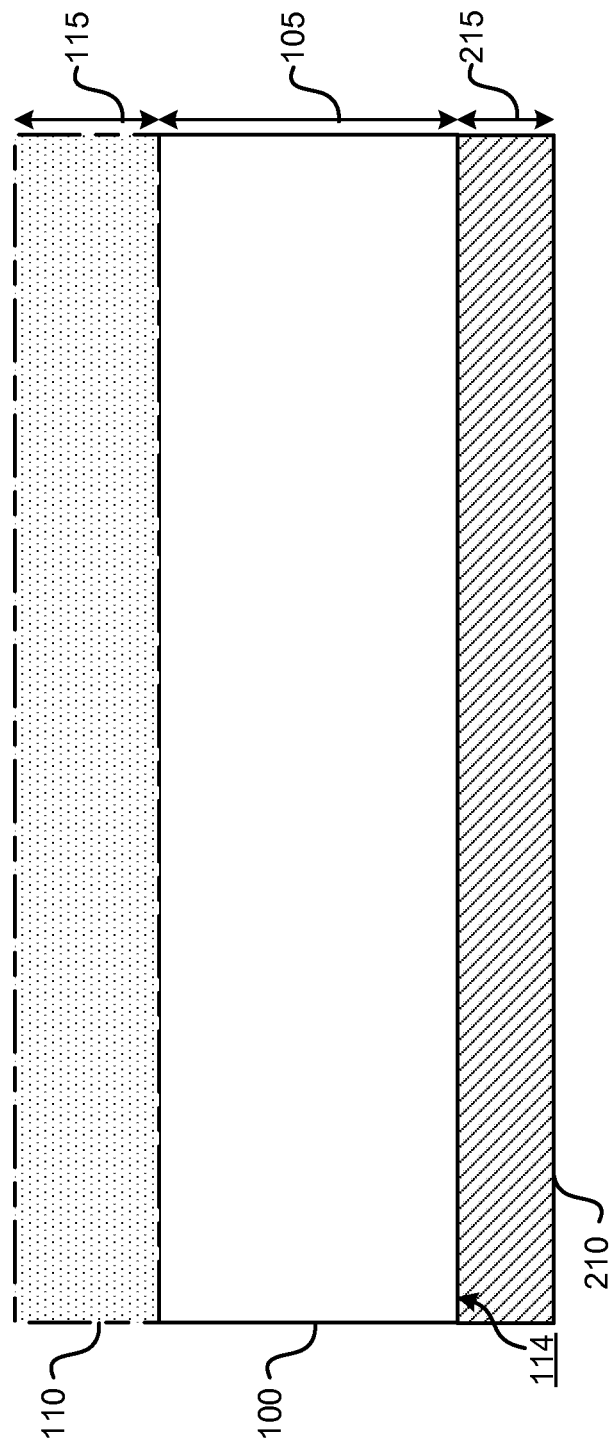
FIGS. 2-6 are simplified cross-sectional diagrams illustrating a process for creating a solderable back metal on a vertical semiconductor device and attaching the device to a package, according to an embodiment of the present invention.

Referring to FIG. 2, an adhesion layer 210 is formed on a bottom surface of a vertical semiconductor device, which includes a GaN substrate 100 and device layer(s) 110. Although embodiments contemplate utilizing an adhesion layer 210 comprising a titanium (Ti), aluminum (Al), or a Ti and Al stack (e.g., a layer of Ti coupled to the back of the GaN substrate 100, and a layer of Al coupled to the layer of Ti) Adhesion layer 210 is also referred to herein as an Ohmic adhesion layer, because this layer should provide a good Ohmic contact to GaN substrate 100. In some embodiments, the specific contact resistance between adhesion layer 210 and GaN substrate 100 is less than $1 \times 10^{-4}$ mohm-cm$^2$. Experimental results have revealed that Al alone can be used as the adhesion layer 210 because it can form an Ohmic contact with the GaN substrate 100 without requiring a high-temperature anneal. This can be advantageous because it can simplify the processing of the devices and remove the possibility of an anneal negatively affecting other aspects of the vertical semiconductor device. In one embodiment, unannealed Al is utilized as an adhesion layer 210 on a surface of a GaN substrate 100 having n-type conductivity. Embodiments typically contemplate forming the adhesion layer 210 on the nitrogen surface of the GaN substrate 100, although other embodiments may include forming the adhesion layer 210 on the gallium surface.

The thickness 215 of the adhesion layer 210 can vary. For example, the thickness 215 of the adhesion layer 210 could be in the range of 100-300 nanometers thick. Furthermore, the respective thicknesses 105, 115 of the GaN substrate 100 and the device layer(s) 110, as well as other properties (e.g., dopant concentration, shape, composition, etc.), also can vary depending on the type of semiconductor devices being fabricated, desired functionality, manufacturing concerns, and/or other factors. Although the GaN substrate 100 is illustrated as including a single material composition, multiple layers can be provided as part of the substrate. Moreover, adhesion, buffer, and other layers (not illustrated) can be utilized during an epitaxial growth process. One of ordinary skill in the art would recognize many variations, modifications, and alternatives.

Some embodiments may include processes that involve polishing and/or other processing the bottom surface 114 of the GaN substrate 100 before the adhesion layer 210 is formed. For example, a GaN substrate 100 can be thinned, after the majority of device processing is completed, to reduce the on-state resistance of the device and lessen the thermal resistance of the device to lower operating temperature and improve its efficiency. The GaN substrate 100 can be thinned using lapping, mechanical polishing, and/or chemomechanical polishing (CMP), in which a slurry such as silica is used because it has a chemical etch component. Furthermore, semiconductor device wafers or diced pieces can undergo surface preparation prior to depositing the adhesion layer 210. Surface preparation treatment may include solvent baths, dry etching, and/or sulfuric acid baths to remove organic contaminants. A wet GaN etch, using for example tetramethyl ammonium hydroxide (TMAH), may also be used. Other treatments, such as hydrofluoric and/orhydrochloric acids may also be used to remove oxides from the bottom surface of the substrate. One purpose of the surface treatment can be to provide a clean surface that adheres well and has low electrical contact resistance to adhesion layer 210. In some embodiments, the roughness of the back surface of GaN substrate 100 is optimized to promote acceptable adhesion of the adhesion layer and acceptable specific contact resistance between GaN substrate 100 and adhesion layer 210. In one embodiment, the root-mean-square (RMS) back surface roughness is between 10 and 200 nanometers.

Figure 3:
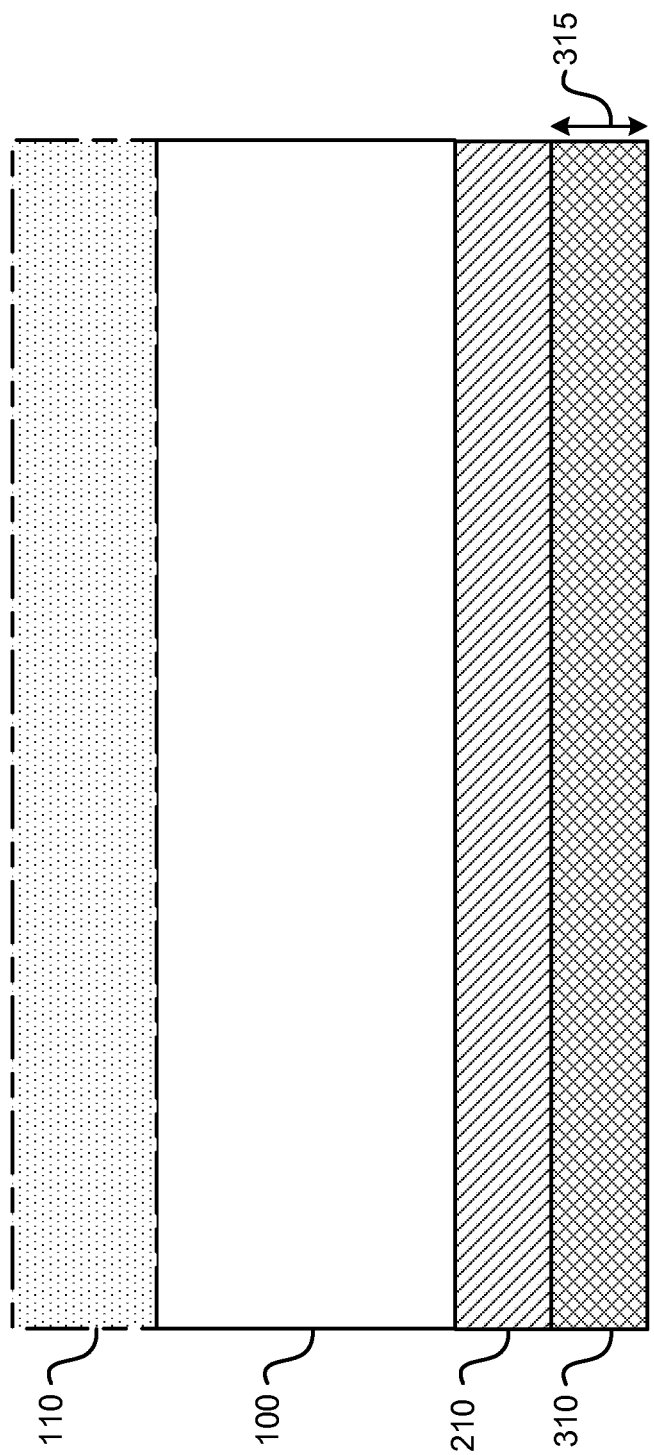

Referring to FIG. 3, a diffusion barrier 310 is formed, coupled to the adhesion layer 210. The diffusion barrier 310 can help protect the adhesion layer 210 from intermixing with other layers, including the solder, when the subsequent solder joint is formed, usually during a reflow process performed at temperatures above 200° C. In some embodiments, the diffusion barrier 310 substantially comprises nickel (Ni), which does not dissolve as quickly in molten solder as other elements. The thickness 315 of the diffusion barrier 310 could vary. This layer can be thick enough to serve as an effective barrier, but not so thick that it induces an unacceptable level of mechanical stress in the backside metal. In some embodiments, for example, the thickness 315 of the diffusion barrier 310 is between 100-300 nanometers thick. In addition or as an alternative to Ni, other acceptable materials for the diffusion barrier 310 may include molybdenum (Mo), platinum (Pt), or paladium (Pd).

Figure 4:
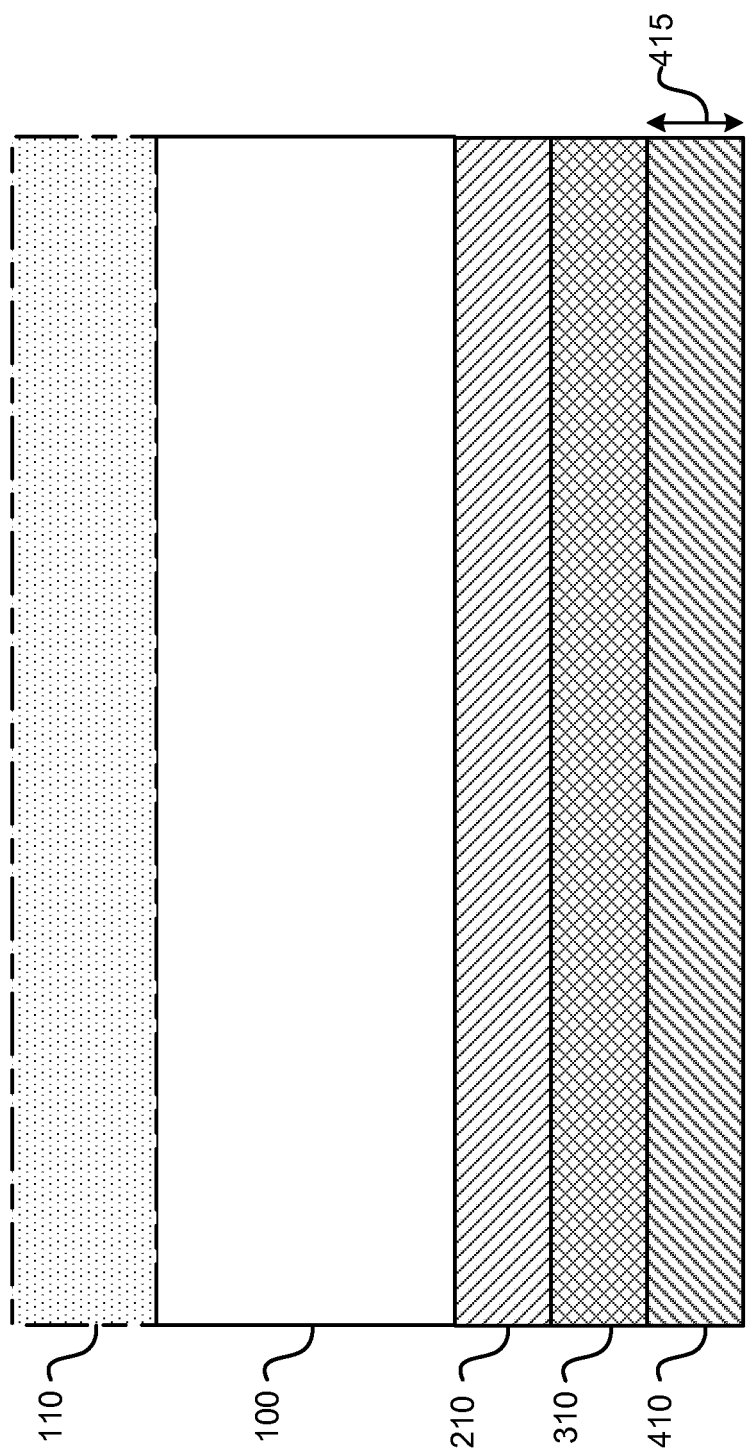

Referring to FIG. 4, a protection layer 410 is formed, coupled to the diffusion barrier 310. In some embodiments, the protection layer 410 can protect the diffusion barrier from oxidation, for example, and may dissolve partially or entirely in the solder during a soldering process. For example, the protection layer 410 may be a layer substantially comprising silver (Ag), because it dissolves in solder but does not adversely affect the solder's mechanical performance over time. Gold (Au) may also be used for protection layer 410, either alone or on top of a layer of Ag. As with other layers 210, 310 of the backside metal, the thickness 415 of the protection layer 410 could vary. In some embodiments, for example, the thickness 415 of the protection layer 410 is between 100-900 nanometers thick.

Figure 5:
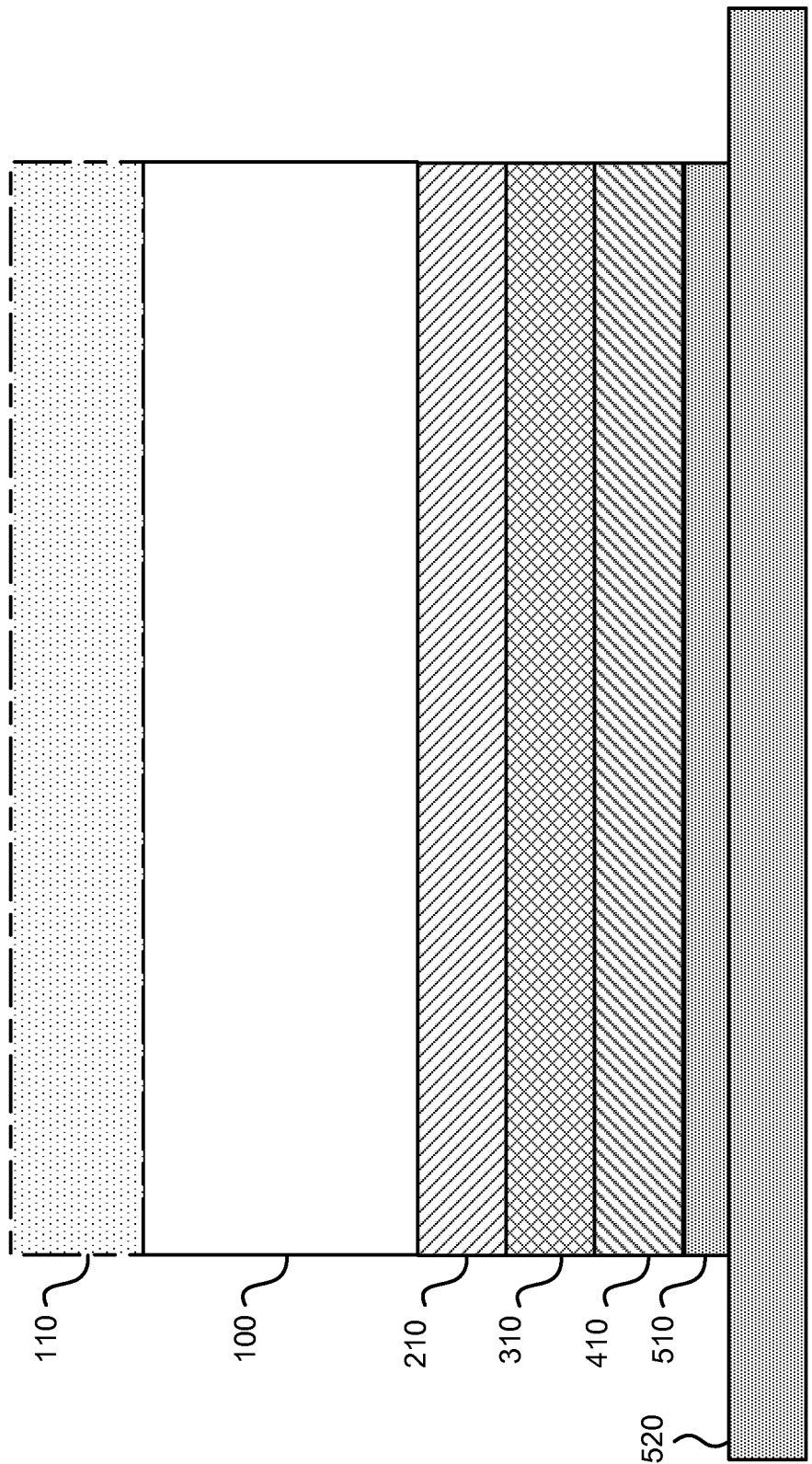

FIG. 5 is a simplified cross-sectional illustration of a process of using a layer of solder 510 to attach the vertical semiconductor device to a lead frame 520. In some embodiments, a die-attach solder 510 is placed on the metal lead frame 520 of a package (e.g. an integrated circuit package or a discrete power device package). Then, the singulated semiconductor device can be placed on top of the solder. In other embodiments, the solder can be disposed on the vertical semiconductor device before placement on the lead frame.

The form of the solder 510 can vary, depending on desired functionality. For example, the solder 510 can be in the form of a solder paste and/or solder preform. The composition of the solder 510 can also vary. In one embodiment, solder 510 comprises at least 80% lead (Pb). Solders with high lead content are relatively pliable, which can help prevent failure due to the different coefficient of thermal expansion (CTE) of the lead frame and the semiconductor material. In some embodiments the solder may comprise 85-98 wt % Pb, 0-10 wt % tin (Sn), and 0-5 wt % Ag. Two specific embodiments of solders are 2 wt % Sn, 95.5 wt % Pb, and 2.5 wt % Ag; and 1 wt % Sn, 97.5 wt % Pb, and 1.5 wt % Ag. The thickness 615 of the solder 510 can vary, depending on the desired solder joint thickness, composition, manufacturing concerns, and/or other factors. In one embodiment, the thickness 615 may be in the range of 10-100 microns.

Once the package, solder 510, and vertical semiconductor device are in place, they can be heated until the solder 510 melts. Soldering temperatures are typically in the range of 200-350° Celsius, and the heating process can take from about 1 to 30 minutes. The solder 510 solidifies as the package, solder, and chip are then cooled. As discussed above, at least a portion of protection layer 410 of the backside metal can dissolve in the solder 510 during this heating and cooling process.

Figure 6:
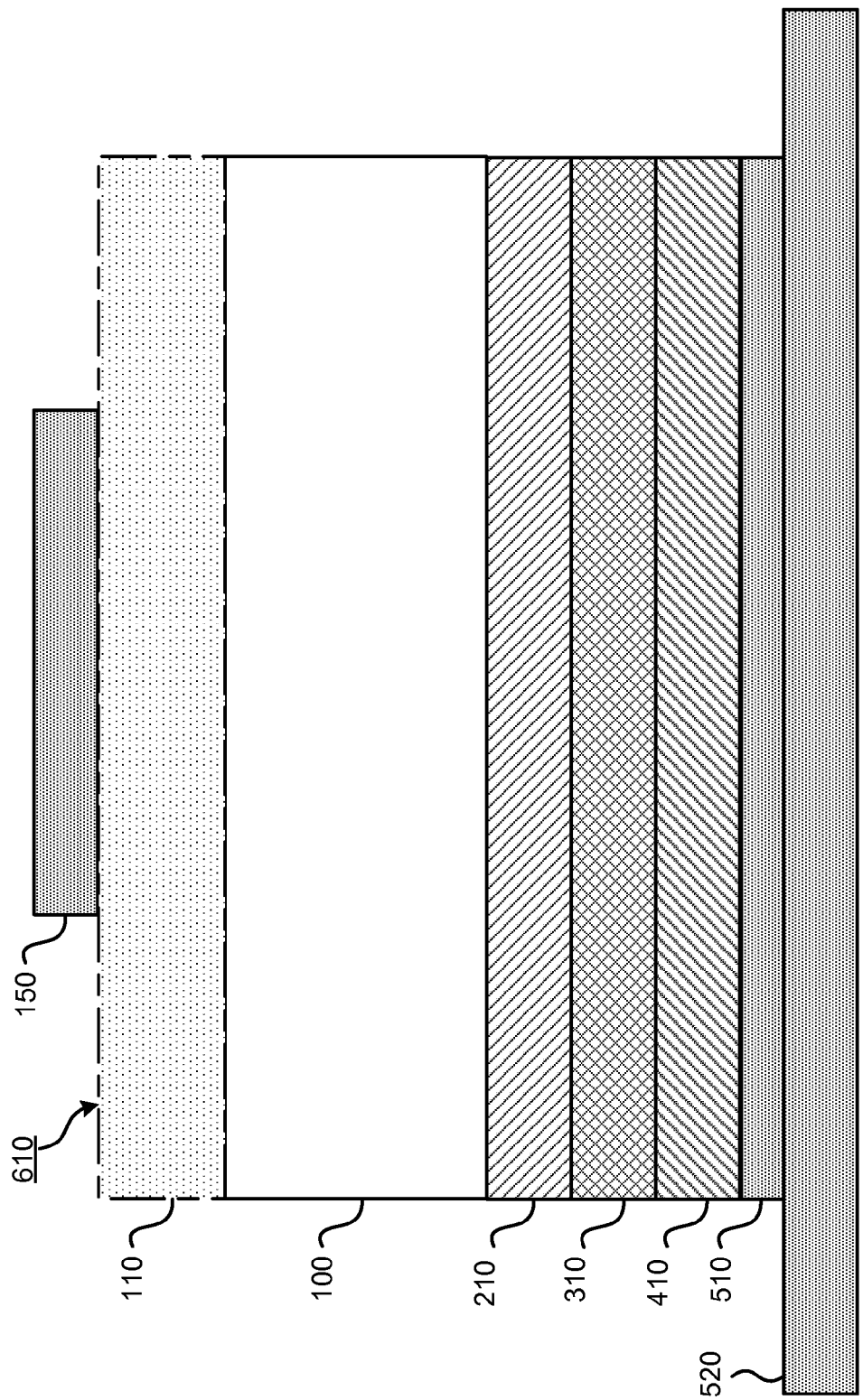

FIG. 6 shows the formation of a metal contact 150 on a top surface 610 of the vertical semiconductor device. The metal contact 150 can be one or more layers of metal and/or alloys to create a Schottky barrier or Ohmic contact with the device layer(s) 110, depending on desired functionality. The metal contact 150 can be formed using a variety of techniques, including lift-off and/or deposition with subsequent etching, which can vary depending on the metals used. In some embodiments, the metal contact 150 can include nickel, platinum, palladium, silver, gold, aluminum, and the like. It can be noted that the formation of the metal contact 150 can occur at different points during the manufacture of the vertical semiconductor device, including before and/or during the formation of any of the backside metal layers 210, 310, 410 and/or the soldering of the vertical semiconductor device to the lead frame 520.

The processes described in relation to FIGS. 2-6 are provided as an example only, and are not limiting. In some embodiments, any of a variety of processing steps may be taken to create the device layer(s) 110. Such processing steps can include, for example, deposition, implantation, etching, and/or other processing steps, which may be performed before, during, and/or after the steps depicted in FIGS. 2-6. Furthermore, the figures are not drawn to scale, and the manufacture of a solderable backside metal can include additional steps and/or features that are not shown. Moreover, as noted above, although these embodiments discussed GaN materials, other III-nitride materials may be used additionally or alternatively. The layers and/or structures described herein may include a number of sublayers, substructures, and/or other components to provide the functionality described herein. One of ordinary skill in the art would recognize many variations, modifications, and alternatives.

Figure 7:
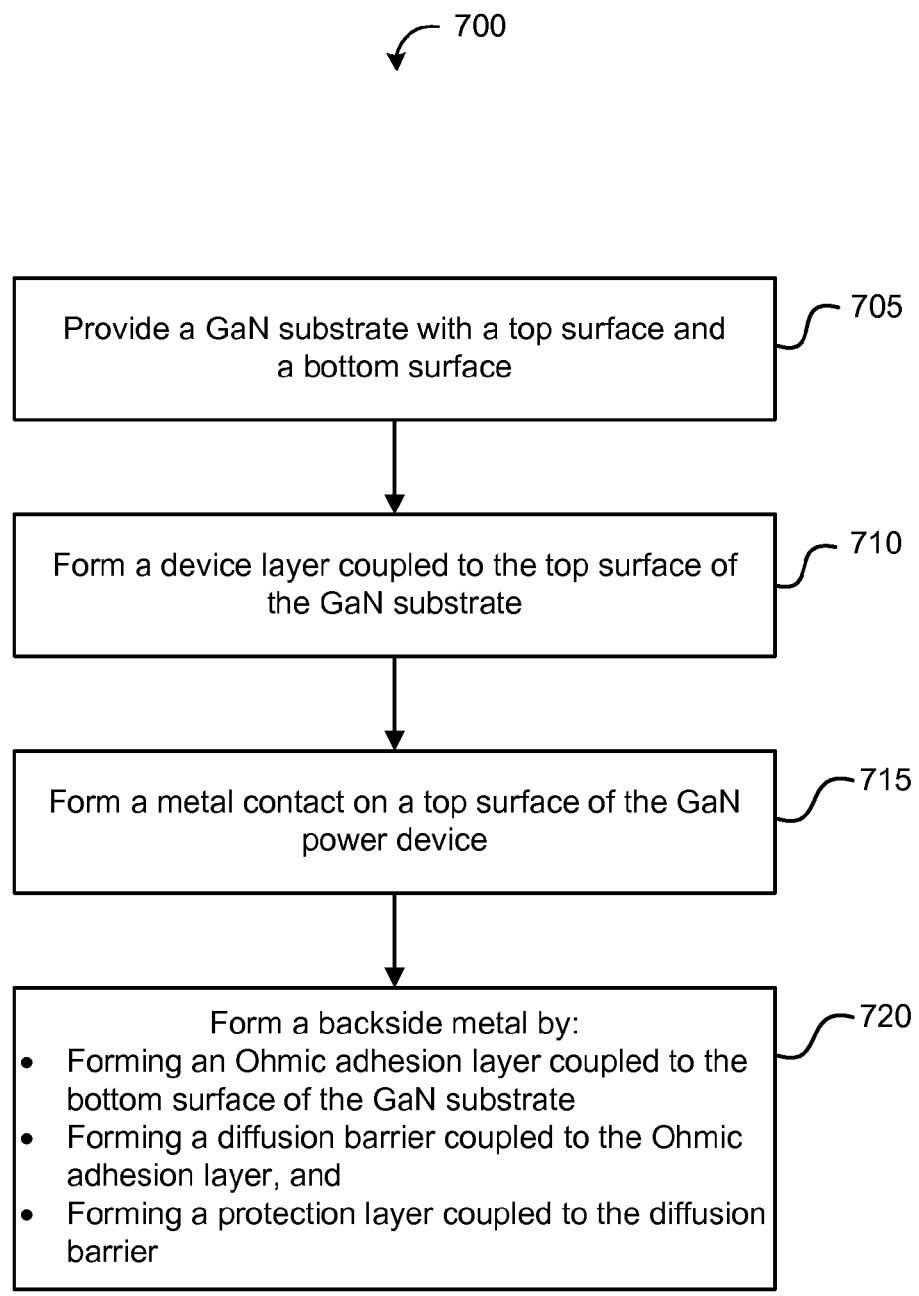
FIG. 7 is a flowchart illustrating a method 800 of fabricating a vertical GaN power device, according to an embodiment of the present invention.

FIG. 7 is a flowchart illustrating a method 700 of fabricating a vertical GaN power device, according to an embodiment of the present invention. The method 700 can begin by providing a GaN substrate with a top surface and a bottom surface (705). The GaN substrate can comprise a bulk Gallium Nitride (GaN) wafer, for example. In one embodiment, the GaN substrate has an n-type conductivity. A device layer coupled to the GaN substrate is then formed (710). In some embodiments, the device layer can comprise an active region including a GaN epitaxial layer. Moreover, in some embodiments, active region can have a lower doping concentration than the GaN substrate. As indicated above, the device layer may be one of a plurality of device layers formed on top of the GaN substrate. The physical properties of these one or more device layers can vary depending on the type of vertical GaN power device being fabricated.

A metal contact on a top surface of the GaN power device is formed (715). As discussed previously, the metal contact can be one of a plurality of metal contacts on a top surface of the GaN power device to provide an electrical contact to the GaN power device. Furthermore, the metal contact can comprise one or more metals and/or layers that may be formed before, after, and/or during the formation of a backside metal. Moreover, subsequent layers may be formed on the top surface of the GaN power device, depending on desired functionality.

A backside metal is formed (720). As discussed above, the backside metal can comprise three layers of metal formed on the GaN substrate. These metal layers can be formed, for example, by evaporation, sputtering, and/or electroplating. Although embodiments provided herein describe three metal layers, other embodiments may include a larger or smaller number of metal and/or other layers, depending on desired functionality, manufacturing concerns, and/or other factors.

According the method 700 of FIG. 7, forming the backside metal includes forming an Ohmic adhesion layer coupled to the bottom surface of the GaN substrate. As indicated previously, the bottom surface of the GaN substrate may be treated before the Ohmic adhesion layer is formed. Such treatment can include, for example lapping and/or polishing, surface preparation (e.g., acid baths to remove organic contaminants and/or oxides), and/or other treatments. In some embodiments, the Ohmic adhesion layer is a layer substantially comprising Al.

A diffusion barrier can be coupled to the Ohmic adhesion layer, as part of the backside metal. The diffusion barrier can comprise one or more materials to help protect the Ohmic adhesion layer from melting, thereby helping prevent diffusion between the Ohmic adhesion layer and subsequently-formed layers. As indicated elsewhere herein, in some embodiments, the diffusion layer substantially comprises Ni, which does not dissolve as readily in molten solder as other elements.

A protection layer can be coupled to the diffusion barrier, as part of the backside metal. The protection layer can comprise one or more materials to help protect the diffusion barrier from oxidation, contamination, and/or other processes that could deteriorate the solderability of the diffusion layer or the electrical or thermal performance of the vertical GaN power device. Some embodiments contemplate the use of a diffusion barrier that substantially comprises Ag because Ag can dissolve in solder without adversely affecting the solder's mechanical performance over time.

It should be appreciated that the specific steps illustrated in FIG. 7 provide a particular method of fabricating a vertical GaN power device according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. The steps shown in FIG. 7 may be performed in methods for fabricating vertical semiconductor devices other than power devices. Additionally or alternatively other semiconductor materials such as other III-nitride materials may be used in addition to or as a substitute for GaN as provided in the method 700 shown in FIG. 7. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a vertical gallium nitride (GaN) power device, the method comprising:
   providing a GaN substrate with a top surface and a bottom surface, wherein a root-mean-square (RMS) surface roughness at the bottom surface of the GaN substrate is more than 20 nm and less than 200 nm;
   forming a device layer contacting the top surface of the GaN substrate;
   forming a metal contact on a top surface of the vertical GaN power device;
   forming a backside metal contacting the bottom surface of the GaN substrate by:
      forming an aluminum adhesion layer directly coupled to the bottom surface of the GaN substrate, wherein the aluminum adhesion layer comprises a first material;
      forming a diffusion barrier coupled to the aluminum adhesion layer, wherein the diffusion barrier comprises a second material, wherein the second material is different from the first material;
      forming a protection layer coupled to the diffusion barrier, wherein the protection layer comprises a third material, wherein the third material is different from the first and second materials;
      forming a fourth layer as part of the aluminum adhesion layer, wherein the fourth layer comprises a fourth material, wherein the fourth material is different from the first, second, and third materials; and
      forming a fifth layer as part of the protection layer, wherein the fifth layer comprises a fifth material, wherein the fifth material is different from the first, second, third and fourth materials,
      wherein the third and fifth materials are selected from gold and silver with a total layer thickness between 100 nm to 900 nm, and
      wherein the first, fourth, second, third and fifth materials are stacked in sequential order,
      wherein the vertical GaN power device is configured to conduct electricity between the metal contact and the backside metal.

2. The method of claim 1 wherein the GaN substrate comprises an n-type GaN substrate.

3. The method of claim 2 wherein the vertical GaN power device is not subject to an anneal temperature greater than 400° C. after the forming of the aluminum adhesion layer.

4. The method of claim 1 wherein forming the diffusion barrier includes forming a layer substantially comprising nickel.

5. The method of claim 1 wherein forming the protection layer includes forming a layer substantially comprising silver.

6. The method of claim 1 further comprising polishing the bottom surface of the GaN substrate before forming the aluminum adhesion layer.

7. The method of claim 1 wherein the aluminum adhesion layer comprises an unannealed aluminum adhesion layer.

8. The method of claim 7 further comprising soldering, wherein the soldering comprises placing a solder between the protection layer and a metal lead frame and subsequently heating the solder beyond its melting temperature.

9. The method of claim 8 wherein the solder comprises:
at least one of a paste or a preform, and
wherein the solder comprises at least 80 wt % lead.

10. A semiconductor device comprising:
a gallium nitride (GaN) substrate with a top surface and a bottom surface;
a device layer contacting the top surface of the GaN substrate, wherein a root-mean-square (RMS) surface roughness at the bottom surface of the GaN substrate is more than 20 nm and less than 200 nm;
a metal contact coupled to the device layer; and
a backside metal contacting the bottom surface of the GaN substrate and comprising:
an aluminum adhesion layer directly coupled to the bottom surface of the GaN substrate, wherein the aluminum adhesion layer comprises a first material;
a diffusion barrier coupled to the aluminum adhesion layer, wherein the diffusion barrier comprises a second material, wherein the second material is different from the first material;
a protection layer coupled to the diffusion barrier, wherein the protection layer comprises a third material, wherein the third material is different from the first and second materials;
a fourth layer, wherein the fourth layer is part of the aluminum adhesion layer, and wherein the fourth layer comprises a fourth material, wherein the fourth material is different from the first, second, and third materials; and
a fifth layer, wherein the fifth layer is part of the protection layer, and wherein the fifth layer comprises a fifth material, wherein the fifth material is different from the first, second, third and fourth materials,
wherein the third and fifth materials are selected from gold and silver with a total layer thickness between 100 nm to 900 nm,
wherein the first, fourth, second, third and fifth materials are stacked in sequential order, and
wherein the semiconductor device is configured to conduct electricity between the metal contact and the backside metal.

11. The semiconductor device of claim 10 wherein the GaN substrate comprises an n-type GaN substrate.

12. The semiconductor device of claim 11 wherein the aluminum adhesion layer is not subject to an anneal temperature greater than 400° C.

13. The semiconductor device of claim 10 wherein the diffusion barrier substantially comprises nickel.

14. The semiconductor device of claim 10 wherein the protection layer substantially comprises silver.

15. The semiconductor device of claim 10 further comprising a solder material coupled to the backside metal.

16. The semiconductor device of claim 10 wherein the aluminum adhesion layer comprises an unannealed aluminum adhesion layer.

17. The semiconductor device of claim 15 wherein the solder material comprises a solder paste, a solder preform, or both.

18. The semiconductor device of claim 15 further comprising a lead frame electrically coupled to the backside metal by the solder material.

* * * * *